United States Patent
Lebby et al.

[11] Patent Number: 6,097,528
[45] Date of Patent: Aug. 1, 2000

[54] MICROSCANNER FOR PORTABLE LASER DIODE DISPLAYS

[75] Inventors: Michael S. Lebby, Apache Junction; Jamal Ramdani, Gilbert; Karen E. Jachimowicz, Laveen, all of Ariz.

[73] Assignee: Motorola, Inc., Schaumburg, Ill.

[21] Appl. No.: 09/119,314

[22] Filed: Jul. 20, 1998

[51] Int. Cl.[7] .............................. G02F 1/03; G02B 26/08; G09G 3/04
[52] U.S. Cl. ...................... 359/251; 359/201; 359/202; 345/32
[58] Field of Search .......................... 372/14, 24; 345/31, 345/32, 44, 45, 46, 82, 83; 359/201, 202, 197, 198, 298, 251

[56] References Cited

U.S. PATENT DOCUMENTS

| | | | |
|---|---|---|---|
| 5,325,386 | 6/1994 | Jewell et al. | 372/50 |
| 5,329,103 | 7/1994 | Rando | 235/462 |
| 5,673,139 | 9/1997 | Johnson | 359/291 |
| 5,739,945 | 4/1998 | Tayebati | 359/291 |

FOREIGN PATENT DOCUMENTS

| | | |
|---|---|---|
| 5-215980 | 8/1993 | Japan . |
| 6-283815 | 10/1994 | Japan . |
| 9-050476 | 2/1997 | Japan . |

*Primary Examiner*—Georgia Epps
*Assistant Examiner*—Michael A. Lucas
*Attorney, Agent, or Firm*—Eugene A. Parsons; William E. Koch

[57] ABSTRACT

A microscanner composed of a semiconductor wafer, having formed as a part thereof a cantilevered portion and having mounted thereon at least one laser diode. The cantilevered portion has electrically interfaced thereto a plurality of interconnects capable of delivering varying voltages. The cantilevered portion is deflected in response to the varying voltages and therefore produces a scanning action about an "x" axis, a "y" axis, or an "x" and "y" axis dependent upon the external varying voltage applied thereto and the design of the cantilevered portion. This scanning action operates to scan the light emitted by the at least one laser diode. The microscanner operates to generate a resultant integrated scanned image. This image can be implemented as either a virtual image display or a projected image display.

18 Claims, 3 Drawing Sheets

MICROSCANNER FOR PORTABLE LASER DIODE DISPLAYS

FIELD OF THE INVENTION

The present invention pertains to the field of visual displays, and more particularly to display systems that utilize laser scanning devices to generate a fully integrated image within an observer's field of view.

BACKGROUND OF THE INVENTION

The human visual system is a complex system with a great ability to absorb vast amounts of information originating in many varying formats, including visual displays. Visual displays are found in varying sizes and forms in today's world, displaying many types of information, from large visual display screens announcing scheduling information found in airports, to small visual displays, such as those incorporated into pocket calculators. Included within these visual displays are direct view displays, including projection displays, and virtual image displays. Of concern in the reduction in the size of visual displays, specifically those utilized in portable electronic devices, such as portable communications equipment, smart-card reader devices, or the like, is the display resolution quality and the maintenance of minimal power requirements and low manufacturing costs.

Of relevance in the reduction in size of visual displays, and the maintenance of resolution quality, is the human visual system's ability to process and integrate information, and the speed at which the visual system is able to do so. Accordingly, scanning techniques have become of great importance in the field of visual displays. In theory, the human visual system can process and interpret information no faster than approximately 60 Hz. Therefore, an image that is projected and scanned within 1/60th of a second to varying positions within a visual display is seen by the eyes of the viewer as one enlarged integrated image. As an example, by moving an image of an "A" to six different locations within a visual display, at a speed of 60 Hz, the viewer will see one integrated image composed of six "A"s. If the image is simultaneously content modulated, for example, the images are of six letters "A", "B", "C", "D", "E" and "F" that are individually and sequentially moved to six varying positions at a speed of 60 Hz., the viewer will see one integrated image composed of the six letters. This process, more commonly known as time-multiplexed imagery, can be utilized in the field of display technology through the use of scanners, and more specifically in the development of enhanced resolution miniature visual displays, including projection displays.

Scanning devices utilized today aid in increasing the resolution of visual displays and decreasing power requirements through the utilization of fewer light sources. These scanning devices can be found in many forms, most commonly electromechanical scanners incorporating mirrors, such as galvanometric scanners and polygonal scanners. Of particular interest, are virtual displays and projection displays and the use of deformable mirrors to achieve scanning and thus generation of a displayed image. These types of electromechanical scanners are commonly quite large in size, therefore not amenable to the incorporation into a display device that is small, lightweight, operates with low power consumption and is meant to be portable in nature. In addition, mechanical scanners, such as though utilizing deformable mirrors, are complex, require separate light sources and thus expensive to manufacture and in many instances utilize great amounts of power during operation.

Thus, there is a need for a miniature visual display that includes a small scanning device that allows for the generation of a high resolution miniature visual display, in particular either a virtual image display or a projection display, that operates by employing a microscanner that utilizes "x" and "y" scanning techniques. In particular the microscanner operates by scanning individual lasers or laser arrays, to create a complete scanned image. Accordingly, it is highly desirable to provide for a scanning device, that utilizes a silicon wafer having positioned on a cantilevered portion thereof, a single laser device or a plurality of laser devices, thereby providing for the scanning of an individual pixel, and/or pixels, thus generating a low-powered virtual image display or a projection display for use with portable electronic equipment.

It is a purpose of the present invention to provide a new and improved laser diode microscanner for use in virtual image displays and projection displays.

It is a further purpose of the present invention to provide a new and improved laser diode microscanner which utilizes varying electrostatic charges to achieve "x" and/or "y" scanning, thereby allowing for the incorporation of the microscanner into miniature virtual image displays and projection displays.

SUMMARY OF THE INVENTION

The above problems and others are substantially solved and the above purposes and others are realized in a microscanner including a semiconductor wafer, such as a silicon wafer, having formed as a part thereof a cantilevered portion having mounted thereon at least one laser diode. The laser diode having electrically interfaced thereto a plurality of interconnects capable of delivering a voltage. The cantilevered portion having electrically interfaced thereto a plurality of interconnects capable of delivering varying voltages. The cantilevered portion is deflected in response to the varying voltages and therefore produces a scanning action in an "x" and/or "y" direction dependent upon the external varying voltage applied thereto and the design of the cantilevered portion. In a preferred embodiment the microscanner operates to generate a full color virtual image or a projection image and therefore utilizes a red, a green and a blue laser diode. The red, green and blue laser diodes are mounted on a cantilevered portion of the silicon wafer thereby characterized as scanning the light generated by the laser diodes in response to varying electrical stimuli applied thereto and thereby generating a resultant integrated image.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

During the course of this description, like numbers are used to identify like elements according to the different figures that illustrate the invention. The present invention is based on utilizing individually addressable visible light emitting devices, more particularly laser diodes, including edge emitting laser and vertical cavity surface emitting lasers (VCSELs), that in combination with driver/control circuitry compose the microscanner of the present invention. Scanning techniques are employed to create a high resolution image from a small number of light sources. This scanning action forms what appears to the observer to be a high resolution integrated image. Those skilled in the art will appreciate that scanning allows a full page display to be created from a small number of light sources. The resultant integrated image is viewable as either a virtual image or a projected image.

The scanning process utilized in the present invention is based on the principle of "x" and "y" scanning, thereby altering the path of light emitted by portions or elements of the array. More particularly, in the preferred embodiment a microscanner, having mounted thereto a cantilevered portion at least one light emitting device, is utilized to which an external stimulus is applied, thereby providing for "x" and/or "y" scanning dependent upon the electrostatic charge applied thereto. This resulting scanning of the light allows for the image source, having minimal light sources (laser diodes) to generate an integrated image that appears to be composed of a high number of pixels.

In the preferred embodiment, the use of a microscanner to bring about the scanning of the light emitted by the laser diodes, allows for a display system into which the microscanner is included to remain small in size and permits it to be incorporated into miniature visual displays such as those found in portable electronics equipment, or the like.

Figure 1:
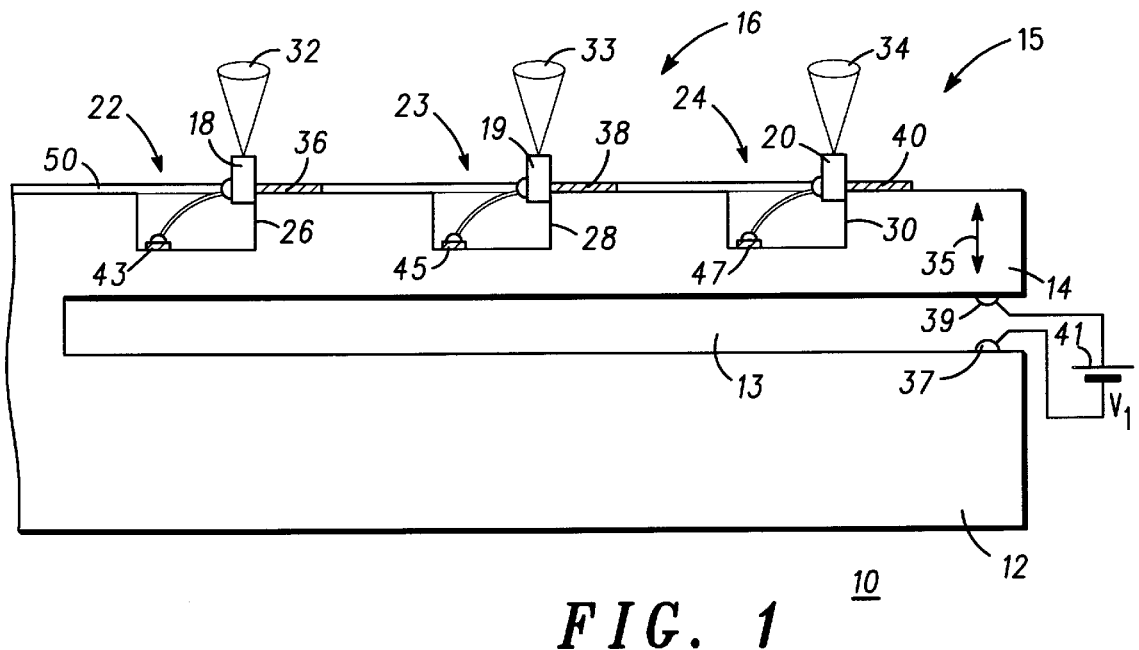
FIG. 1 is a simplified sectional view taken through line 1—1 of FIG. 2, illustrating a portion of a microscanner including a plurality of spaced laser diodes according to the present invention.
Figure 2:
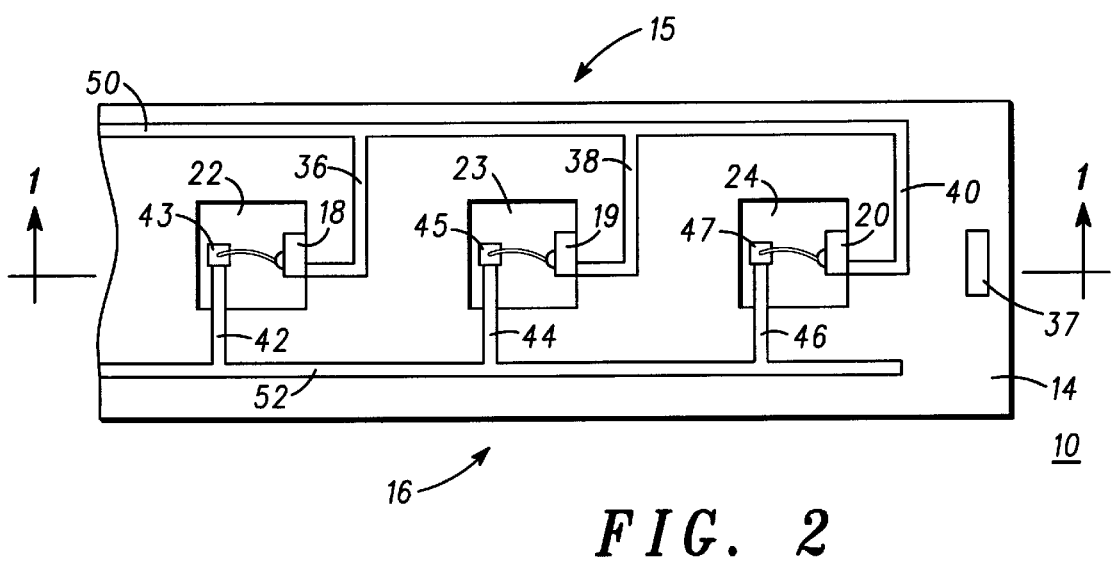
FIG. 2 is a simplified top view of the microscanner of FIG. 1, illustrating the electrical interface of each laser diode according to the present invention.

Referring now to the accompanying illustrations, and more specifically to FIGS. 1 and 2, illustrated is a first embodiment of a portion of a microscanner 10 according to the present invention. Microscanner 10 includes a silicon wafer 12 having formed as a part thereof a cantilevered portion 14 using standard cantilever fabrication approaches and thereby defining a gap 13. A plurality of laser diodes 16 are positioned in a central aspect 15 of cantilevered portion 14 which is characterized as undergoing deflection in response to an electrostatic charge applied thereto. In this embodiment, plurality of laser diodes 16 includes a red laser diode 18, a green laser diode 19 and a blue laser diode 20, thereby capable of generating a full color image. It should be understood that the placement of laser diodes 18, 19 and 20 is exemplary and other layouts are anticipated by this disclosure and are design specific dependent upon scanning techniques utilized and desired image outcome. A plurality of cavities 22, 23 and 24 are fabricated into cantilevered portion 14 and defined by a plurality of sidewalls. Laser diodes 16 are mounted on a side walls 26, 28 and 30 of cavities 22, 23, and 24, respectively. As illustrated, laser diodes 18, 19 and 20 emit light, as illustrated and referenced 32, 33, and 34.

During operation an external electrical stimulus supplies varying electrostatic charges to scanner 10, thereby causing cantilevered portion 14 to deflect along an "x" axis, as illustrated by directional arrow 35, relative to a lower portion of silicon wafer 12. This deflection of cantilevered portion 14 allows for scanning in an "x" direction of light emitted by laser diodes 18, 19 and 20.

Referring now to FIG. 2, plurality of electrical interconnects 36, 38 and 40 are illustrated for electrical interface of a positive terminal or contact of laser diodes 18, 19 and 20 to an external power source (not shown). In this particular embodiment, electrical interconnects 36, 38 and 40 provide for the positive interface and a plurality of interconnects 42, 44, and 46 provide for the negative interface with negative terminals, or contacts, 43, 45, and 47 and the external power source (not shown). A plurality of electrical interconnects, or traces, 50 and 52, electrically interface the positive and negative interconnects of diodes 18, 19 and 20 to the external power source (not shown). In addition, there is provided on cantilevered portion 14 and substrate 12 a plurality of electrical contacts 37 and 39, electrically interfaced with a voltage source 41, so as to create a deflection of cantilevered portion 14 in response to the varying voltages applied by voltage source 41. The voltage is exerted so as to create an electromagnetic field across gap 13 defined by cantilevered portion 14 and lower portion of silicon wafer 12. This creation of an electromagnetic field provides for cantilevered portion 14 to be attracted or repelled dependent upon the charge across gap 13. This attracting or repelling of cantilevered portion 14 causes the deflection of cantilevered portion 14 and thus provides for the scanning action of laser diodes 18, 19 and 20.

The contacts to the laser diodes 18, 19 and 20 and contacts 37 and 39 are formed by conventional deposition and/or etching techniques wherein, for example, common row and column bus contacts 36, 38, 40, 42 and 44 are formed to individually address each laser diode 18, 19, and 20, as is generally known in the art. There is provided a plurality of driver/control circuits (not shown) having data input terminals and further having control signal output terminals connected to the laser diodes 18, 19 and 20 through a plurality of connection pads (not shown), for activating and controlling each of the laser diodes 18, 19 and 20 and a plurality of driver/control circuits (not shown) having input terminals and further having output terminals connected to contacts 37 and 39, in combination characterized as generating an image utilizing scanning techniques in accordance with signals applied to the input terminals.

In the present invention, a small number of interconnects are needed in that there are a small number of light emitting devices, or laser diodes, required to be defined because of the utilization of scanning techniques. Because of this small number of interconnects, the manufacturing yield of microscanner 10 is high, thereby resulting in low manufacturing costs. In addition to serving as a means for the placement of electrical interconnects, silicon wafer 12 additionally serves as a protective element for diodes 18, 19 and 20, more particularly for thermal heat-sinking.

During the scanning process, varying external voltages are applied to microscanner 10, more particularly to cantilevered portion 14. The light emitted by diodes 18, 19 and 20 is scanned relative to the degree of deflection of cantilevered portion 14 in response to the varying voltages applied, resulting in a scanning action of the light emitted therefrom. Generally speaking, the resultant light emitted, having undergone a change in an "x" direction, changes direction of travel to fill an area of a display with a specific portion of the image. The scanning action works by scanning image data information.

Figure 3:
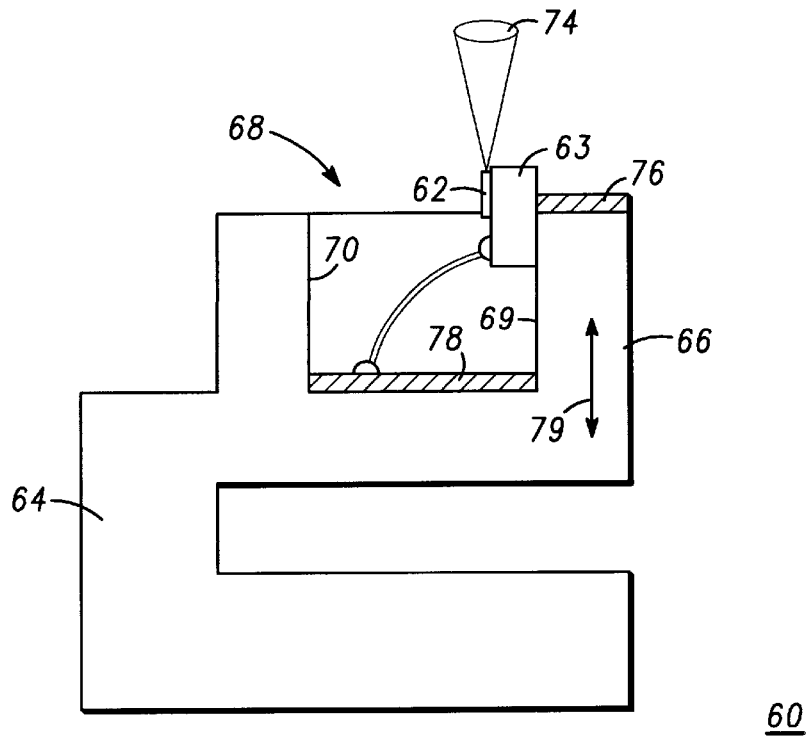
FIG. 3 is a simplified sectional view of a single edge emitting laser diode microscanner according to the present invention.

Referring now to FIG. 3, illustrated in simplified sectional view is a single laser diode microscanner according to the present invention. In this particular embodiment, a microscanner 60 is disclosed as including a single laser diode 62 mounted to a silicon wafer 64. Silicon wafer 64 has formed as a part thereof a cantilevered portion 66 and a cavity 68, including a plurality of sidewalls 69 and 70. A laser diode 62 is mounted on sidewall 69, so as to emit light in an upward direction as noted by light cone 74. In this particular embodiment, laser diode 62 is disclosed as an edge emitting laser, fabricated on a substrate 63 as is generally well known in the art. More particularly, in that edge emitting laser 62 emits light about an edge of the laser diode device, laser 62 is mounted vertically, inside cavity 68 of silicon wafer 64.

There is provided a positive electrical interconnect 76 and a negative electrical interconnect 78 positioned on silicon wafer 64, thereby electrically interfacing laser diode 62 with an external voltage source (not shown). In addition, cantilevered portion 66 includes electrical interconnects (not shown), thereby electrically interfacing cantilevered portion 66 to an external voltage source (not shown) such as that previously described with regard to FIGS. 1 and 2.

During operation, microscanner 60 under the influence of a varying voltage, undergoes a deflection of cantilevered portion 66, thereby providing for a scanning of light 74 emitted by laser diode 62. This movement of cantilevered portion 86 as illustrated by reference numeral 79, allows for scanning in an "x" direction.

Figure 4:
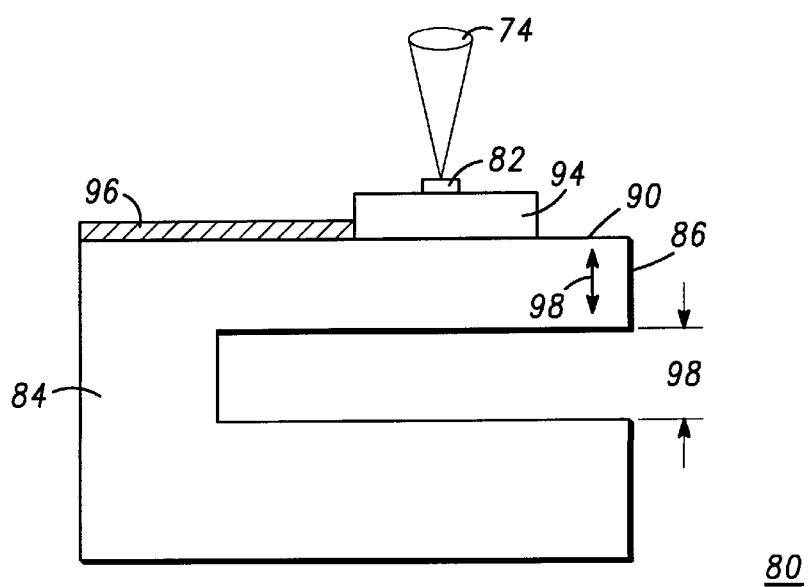
FIG. 4 is a simplified sectional view of single vertical cavity surface emitting laser diode microscanner according to the present invention.

Referring now to FIG. 4, illustrated in simplified sectional view is an alternative embodiment of a single laser diode microscanner according to the present invention. In this particular embodiment, a microscanner 80 is disclosed as including a single laser diode 82 mounted to a silicon wafer 84. Silicon wafer 84 has formed as a part thereof a cantilevered portion 86. Laser diode 82 is mounted on an uppermost surface 90 of cantilevered portion 86, so as to emit light in an upward direction as noted by light cone 92. In this particular embodiment, laser diode 82 is disclosed as a vertical cavity surface emitting laser, fabricated on a substrate 94 as is generally well known in the art. Vertical cavity surface emitting laser (VCSEL) 82 is disclosed as including one of a ridge VCSEL, a planar VCSEL, or an oxide based VCSEL. Further information on the fabrication of VCSELs can be found in U.S. Pat. No. 5,258,316, entitled, "PATTERNED MIRROR VERTICAL CAVITY SURFACE EMITTING LASER", issued Nov. 2, 1993, and U.S. Pat. No. 5,293,392, entitled "TOP EMITTING VCSEL WITH ETCH STOP LAYER", issued Mar. 8, 1994, both assigned to the same assignee and incorporated herein by this reference.

There is provided an electrical interconnect 96 positioned on silicon wafer 84, thereby electrically interfacing laser diode 82 with an external voltage source (not shown). In addition, cantilevered portion 86 includes electrical interconnects (not shown), thereby electrically interfacing cantilevered portion 86 to an external voltage source (not shown) such as that previously described with regard to FIGS. 1 and 2.

During operation, microscanner 80 under the influence of a varying voltage, undergoes a deflection of cantilevered portion 86, thereby providing for a scanning of light 92 emitted by laser diode 82. This movement of cantilevered portion 86 as illustrated by reference numeral 98, allows for scanning in an "x" direction. By using this scanning technique, an integrated image is formed having high resolution. It should be understood that while FIGS. 3 and 4 illustrate single laser diode microscanners, generally for use in the generation of a monochrome image, multi-laser diode microscanners, such as that illustrated in FIG. 1, are anticipated by this disclosure. In particular multi-laser diode microscanners that include a red, a green and a blue laser diode so as to generate a full color image are disclosed herein.

Referring now to FIGS. 5–10, illustrated are a variety of laser diode layouts for the microscanner of the present invention dependent upon the type of scanning sought to be achieved. As illustrated, "x" scanning, "y" scanning, or synchronized "x" and "y" scanning are anticipated.

Figure 5:
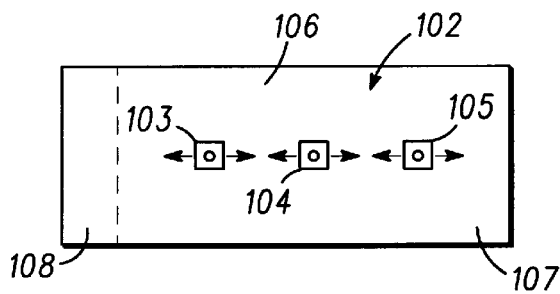
FIGS. 5–10 illustrate in simplified top views and a side sectional view a plurality of specific cantilevered microscanner embodiments for "x" and/or "y" scanning according to the present invention.

Referring more specifically to FIG. 5, illustrated in simplified top view is a microscanner 100 illustrating a laser diode layout for "x" scanning. Microscanner 100 includes a plurality of laser diodes 102, generally including a red laser diode 103 emitting light in a range of 635–670 nm, a green laser diode 104 emitting light in a range of 540–560 nm, and a blue laser diode 105 emitting light in a range of 410–460 nm. A solid aspect of microscanner 100 includes a silicon wafer 106, of which included is a cantilevered portion 107, having support noted by portion 108. This type of cantilevered arrangement allows movement of cantilevered portion 107 about an "x" axis, thus achieving scanning in an "x" direction as noted by the illustrative directional arrows.

Figure 6:
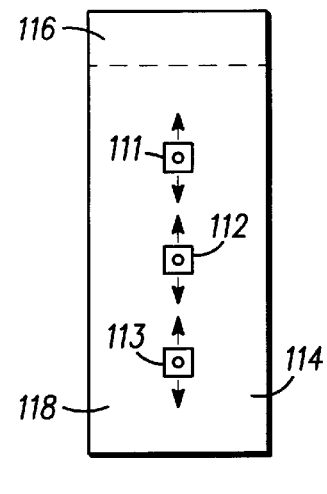

Referring to FIG. 6, similar to the microscanner 100 of FIG. 5, illustrated is a microscanner 110 having mounted thereon a plurality of laser diodes 111, 112 and 113. A solid aspect of microscanner 110, more particularly the support provided by a silicon wafer 114, is noted by portion 116. This type of cantilevered arrangement allows for movement of a cantilevered portion 118 about a "y" axis, thus achieving scanning in an "y" direction as noted by the illustrative directional arrows.

Figure 7:
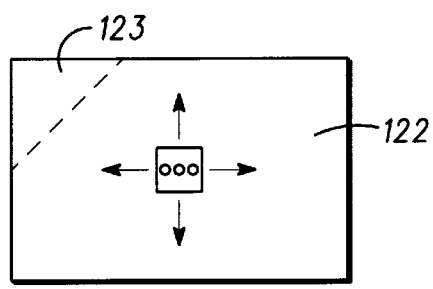

Referring now to FIGS. 7–10, illustrated are varying laser diode layouts which allow for scanning in both an "x" and "y" direction. Referring more specifically to FIG. 7, illustrated is a microscanner 120, having a cantilevered portion 122, and a solid support portion 123. The cantilevering as illustrated in this particular embodiment allows for the movement of cantilevered portion 122 about both an "x" and "y" axis dependent upon varying voltages applied thereto, thus scanning in both an "x" and "y" direction.

Figure 8:
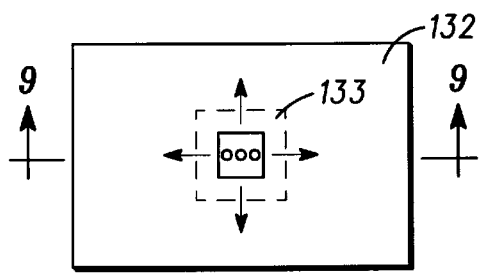
Figure 9:
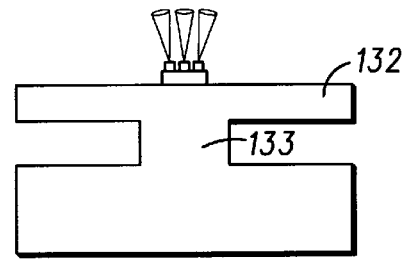

Referring now to FIGS. 8 and 9, illustrated is a microscanner 130, having a cantilevered portion 132, and a solid support portion 133. The cantilevering as illustrated in this particular embodiment allows for the movement of cantilevered portion 132 about both an "x" and "y" axis as illustrated by the directional arrows, dependent upon varying voltages applied thereto, thus scanning in both an "x" and "y" direction.

Figure 10:
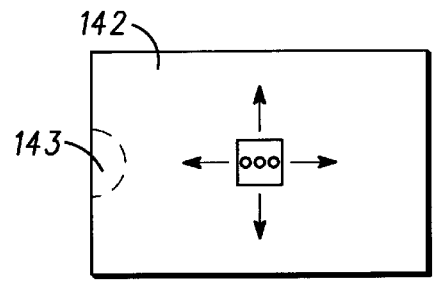

Referring now to FIG. 10, illustrated is a final embodiment of a microscanner 140, having a cantilevered portion 142, and a solid support portion 143. The cantilevering as illustrated in this particular embodiment allows for the movement of cantilevered portion 142 about both an "x" and "y" axis as illustrated by the directional arrows, dependent upon varying voltages applied thereto, thus scanning in both an "x" and "y" direction.

Thus, a new and improved microscanning device which is intended for incorporation into a portable electronic device for the generation of a miniature virtual image display or a projection display is disclosed which is relatively easy and inexpensive to manufacture. The microscanner includes various optical components while conveniently integrating electrical connections to the components and providing external connections thereto. By using laser diodes for the light source, which are scanned to generate a resultant integrated image, characterized by high resolution, the size of the microscanner is reduced and the electrical power required is also minimized.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A microscanner comprising:
    a semiconductor wafer having integrally fabricated as a part thereof a cantilevered portion characterized as deflectable about at least one of an "x" axis and a "y" axis relative to a lower portion of the semiconductor wafer in response to an electrical stimulus applied thereto;
    at least one laser diode mounted to a surface of the cantilevered portion;
    a plurality of electrical interconnects in electrical interface with the at least one laser diode and the cantilevered portion; and
    at least one driver/control circuit connected to the at least one laser diode for delivering a voltage in response to data input and a driver/control circuit connected to the semiconductor wafer for delivering a plurality of varying voltages across the cantilevered portion, thereby deflecting the cantilevered portion in response thereto and generating a resultant integrated image viewable by an observer.

2. A microscanner as claimed in claim 1 wherein the semiconductor wafer is a silicon wafer.

3. A microscanner as claimed in claim 2 wherein the at least one laser diode includes a red laser diode, a green laser diode and a blue laser diode.

4. A microscanner as claimed in claim 2 wherein the at least one laser diode includes an edge emitting laser diode.

5. A microscanner as claimed in claim 2 wherein the at least one laser diode includes a vertical cavity surface emitting laser (VCSEL) diode.

6. A microscanner as claimed in claim 2 wherein the at least one laser diode is mounted within a cavity formed in the cantilevered portion of the semiconductor wafer.

7. A microscanner as claimed in claim 2 wherein the at least one laser diode is mounted on an uppermost surface of the cantilevered portion of the semiconductor wafer.

8. A microscanner comprising:
    a silicon wafer having integrally fabricated as a part thereof a cantilevered portion characterized as deflectable about at least one of an "x" axis and a "y" axis relative to a lower portion of the silicon wafer in response to varying electrostatic charges applied thereto;
    at least one laser diode mounted to a surface of the cantilevered portion;
    a plurality of electrical interconnects in electrical interface with the at least one laser diode and the cantilevered portion; and
    at least one driver/control circuit connected to the at least one laser diode for delivering a voltage in response to data input and a driver/control circuit connected to the silicon wafer for delivering a plurality of varying voltages across the cantilevered portion, thereby deflecting the cantilevered portion in response thereto and generating a resultant integrated image viewable by an observer.

9. A microscanner as claimed in claim 8 wherein the at least one laser diode includes a red laser diode, a green laser diode and a blue laser diode, thereby generating a resultant full color integrated image viewable by an observer.

10. A microscanner as claimed in claim 8 wherein the at least one laser diode includes an edge emitting laser diode.

11. A microscanner as claimed in claim 8 wherein the at least one laser diode includes a vertical cavity surface emitting laser (VCSEL) diode.

12. A microscanner as claimed in claim 8 wherein the at least one laser diode is mounted within a cavity formed in the cantilevered portion of the silicon wafer.

13. A microscanner as claimed in claim 8 wherein the at least one laser diode is mounted on an uppermost surface of the cantilevered portion of the silicon wafer.

14. A microscanner comprising:
    a silicon wafer having integrally fabricated as a part thereof a cantilevered portion characterized as deflectable about at least one of an "x" axis and a "y" axis relative to a lower portion of the silicon wafer in response to varying electrical charges applied thereto;
    a plurality of laser diodes, including a red laser diode, a green laser diode and a blue laser diode mounted to a surface of the cantilevered portion; and
    a plurality of electrical interconnects in electrical interface with the plurality of laser diodes and the cantilevered portion;
    at least one driver/control circuit connected to the plurality of laser diodes for delivering a voltage in response to data input and a driver/control circuit connected to the silicon wafer for delivering a plurality of varying voltages across the cantilevered portion, thereby deflecting the cantilevered portion in response thereto and generating a resultant integrated full color image viewable by an observer.

15. A microscanner as claimed in claim 14 wherein the plurality of laser diodes include a plurality of edge emitting laser diodes.

16. A microscanner as claimed in claim 14 wherein the plurality of laser diodes include a plurality of vertical cavity surface emitting laser (VCSEL) diodes.

17. A microscanner as claimed in claim 14 wherein the plurality of laser diodes are mounted within a plurality of individual cavities formed in the cantilevered portion of the silicon wafer.

18. A microscanner as claimed in claim 14 wherein the plurality of laser diodes are mounted on an uppermost surface of the cantilevered portion of the silicon wafer.

* * * * *